US008723286B2

(12) United States Patent
Barbat

(10) Patent No.: US 8,723,286 B2

(45) Date of Patent: May 13, 2014

(54) SEMICONDUCTOR-METAL COIL UNITS AND ELECTRICAL APPARATUS COMPRISING SAME

(75) Inventor: William N. Barbat, Lake Oswego, OR (US)

(73) Assignee: Levitronics, Inc., Lake Oswego, OR (US)

( * ) Notice: Subject to any disclaimer, the term of this patent is extended or adjusted under 35 U.S.C. 154(b) by 294 days.

(21) Appl. No.: 13/290,999

(22) Filed: Nov. 7, 2011

(65) Prior Publication Data

US 2012/0112305 A1 May 10, 2012

Related U.S. Application Data

(60) Provisional application No. 61/410,808, filed on Nov. 5, 2010.

(51) Int. Cl.
*H01L 31/0352* (2006.01)

(52) U.S. Cl.
USPC .................................. 257/466; 257/E31.104

(58) Field of Classification Search
CPC ........................................................ H01F 5/02
See application file for complete search history.

(56) References Cited

U.S. PATENT DOCUMENTS

2007/0007844 A1 1/2007 Barbat

FOREIGN PATENT DOCUMENTS

JP 3295281 A 12/1991
JP 11273474 A 10/1999

OTHER PUBLICATIONS

International Search Report and Written Opinion for International Application No. PCT/US2011/059638, mailed Jan. 9, 2012, 10 pages.

*Primary Examiner* — Stephen W Smoot

(74) *Attorney, Agent, or Firm* — Klarquist Sparkman, LLP

(57) ABSTRACT

Coil units are disclosed for use in electrical circuits. An exemplary coil unit comprises a rigid substrate having an electrically non-conductive three-dimensional (3-D) surface. At least one 3-D coil (shaped, for example, as a helical coil) of semiconductor material is formed on the substrate surface. Disposed on the at least one coil of semiconductor material is a 3-D coil of a conductive metal. The coil of conductive metal is situated sufficiently closely to the at least one coil of semiconductor material for the coil of conductive metal to produce Coulombic drag in the at least one coil of semiconductor material when the coils are conductive of low-mass electrons. The semiconductor material can be a photoconductor or other material that has conductive low-mass electrons.

39 Claims, 6 Drawing Sheets

SEMICONDUCTOR-METAL COIL UNITS AND ELECTRICAL APPARATUS COMPRISING SAME

CROSS-REFERENCE TO RELATED APPLICATION

This application claims priority to and the benefit of U.S. provisional application No. 61/410,808, filed on Nov. 5, 2010, which is incorporated herein by reference in its entirety.

FIELD

This disclosure pertains to, inter alia, coil units comprising at least one 3-D coil of semiconductor material and at least one 3-D coil of electrically conductive metal. More specifically, the disclosure pertains to such coil units in which at least the metal coil has a helical configuration that extends over one or more helical semiconductor coils or over multiple circular semiconductor coils. This disclosure also pertains to coil assemblies and electrical apparatus comprising one or more such coils.

BACKGROUND

Many semiconductor materials (which include certain photoconductive materials) are extremely difficult to form into three-dimensional (3-D) coils. For making devices, most semiconductor materials are formed as respective layers (two-dimensional or 2-D structures) using any of various surficial techniques such as chemical vapor deposition, physical vapor deposition, epitaxy, sputtering, or vacuum deposition. Whereas these layer-forming techniques are effective for forming substantially 2-D shapes, general success with forming 3-D structures of such materials by these techniques on a size scale greater than MEMS has been elusive. As used herein, a "3-D" or "3-dimensional" structure has respective dimensions in all the x, y, and z directions that are greater than a layer thickness formable by conventional semiconductor layer-forming techniques. For example, a coil made from a thin layer of semiconductor or metal material is a "3-D" structure if it has been formed into a structure having respective dimensions (in each of the x, y, and z directions greater than the thin-layer thickness.

In U.S. Patent Publication No. 2007-0007844 A1, a 3-D semiconductor-metal coil is configured as a metal coil coated with a photoconductive material. The metal coil, made of metal wire, is made first, followed by coating the metal coil with a semiconductor material, such as a photoconductor. Unfortunately, it is difficult to achieve satisfactory adhesion of the photoconductive material to the metal of the coil, even in instances in which the semiconductor material is applied as a slurry to the metal coil. Also, since these coils lack any physical support, they are too fragile for practical use.

SUMMARY

As disclosed herein, the problem of making a functional and reliable 3-D semiconductor-metal coil is solved by methods, devices, and apparatus as disclosed herein. Specifically, an exemplary embodiment of a semiconductor-metal coil unit is fabricated by forming a film of a semiconductor material on a 3-D dielectric surface of a substrate. The surface is sized and shaped (e.g., cylindrical) according to a desired 3-D coil size and shape. Selected regions of the film of semiconductor material are removed from the dielectric surface so that the semiconductor film remaining on the substrate surface defines at least one semiconductor coil having a helical or other 3-D coil configuration. A corresponding conductive-metal coil, fabricated of a metal that desirably is not reactive with the semiconductor material, is disposed on the outer surface of the semiconductor coil, thereby forming a coil unit having at least one semiconductor coil and a metal coil. The coil units can be configured so that multiple coil units can be readily connected to each other mechanically in a manner that also automatically achieves electrical connection of the coil units with each other.

A particularly desirable semiconductor material for making semiconductor coils is any of various photoconductive materials such as, but not limited to, cadmium sulfide and lead sulfide. The photoconductive material (or semiconductor material) can be a mixture of multiple photoconductive (or semiconductor) materials.

The coil units as described herein can be used in various power supply apparatus.

Figure 1:
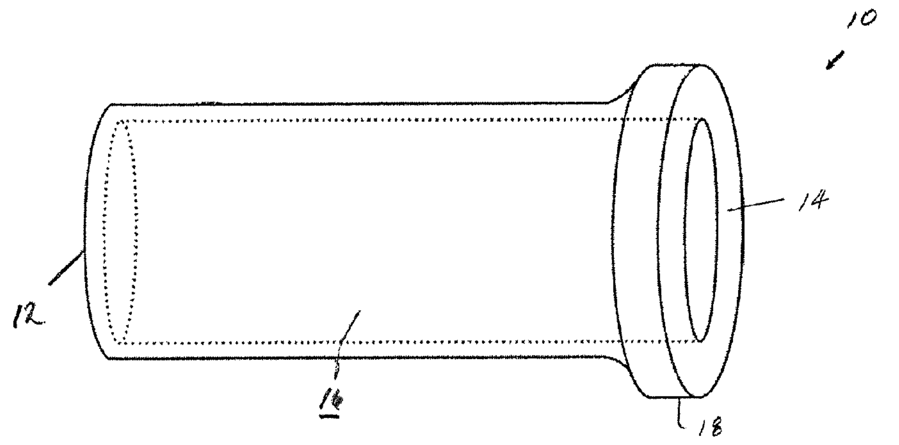
FIG. 1 is a dimetric drawing of an exemplary 3-D substrate for forming a coil unit.

The drawings are intended to illustrate the general manner of construction and are not necessarily to scale. In the detailed description and in the drawings themselves, specific illustrative examples are shown and described herein. It will be understood, however, that the drawings and the detailed description are not intended to limit the invention to the particular forms disclosed, but are merely illustrative and intended to teach one of ordinary skill how to make and/or use the invention claimed herein.

DETAILED DESCRIPTION

The invention is described below in the context of representative embodiments that are not intended to be limiting in any way.

As used in this application and in the claims, the singular forms "a," "an," and "the" include the plural forms unless the context clearly dictates otherwise. Additionally, the term "includes" means "comprises." Further, the term "coupled" encompasses mechanical as well as other practical ways of coupling or linking items together, and does not exclude the presence of intermediate elements between the coupled items.

The described things and methods described herein should not be construed as being limiting in any way. Instead, this disclosure is directed toward all novel and non-obvious features and aspects of the various disclosed embodiments, alone and in various combinations and sub-combinations with one another. The disclosed things and methods are not limited to any specific aspect or feature or combinations thereof, nor do the disclosed things and methods require that any one or more specific advantages be present or problems be solved.

Although execution of disclosed methods may be described herein in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed things and methods can be used in conjunction with other things and methods. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In the following description, certain terms may be used such as "up," "down,", "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Encompassed by the disclosure are coil units, methods for making coil units, and coil assemblies and electrical apparatus comprising one or more coil units. An exemplary coil unit is three-dimensional (3-D), as defined by a substrate providing an electrically non-conductive, 3-D surface on which the coils are situated. Thus, the coils have a corresponding 3-D configuration. The coils comprise at least one coil of semiconductor material situated on the external surface of the substrate and at least one conductive-metal coil overlying (at least in part) the coil(s) of semiconductor material. By forming the coil(s) of semiconductor material on the external 3-D surface of the substrate, the coil(s) of semiconductor material are physically supported and durable. Durability is not compromised by forming, placing, applying, or otherwise attaching the conductive-mental coil(s) on the semiconductor coil(s). The coil units as described herein overcome the conventional difficulty of achieving satisfactory adhesion of semiconductor material to metal in 3-D structures.

Particularly advantageous semiconductor materials for use in making coil units are the various semiconductor materials that are photoconductive. These materials are called "photoconductive materials." An example photoconductive material, not intending to be limiting, is cadmium sulfide (CdS). As used herein, "semiconductor" encompasses photoconductors.

In a coil unit, a particularly advantageous coil shape is helical, which is a 3-D structure that is readily formable on the outside surface of a cylindrical substrate made of a dielectric material or comprising one or more layers of dielectric material on which coils can be formed. In a useful embodiment of the subject method, the semiconductor coil(s) is formed on the substrate first, followed by disposition of the metal coil(s) on the surface of the semiconductor coil.

3-D Coil Unit

In an exemplary embodiment of a coil unit, a film of semiconductor material is formed on the exterior surface of a substantially cylindrical tube 10 or other similarly shaped, rigid, electrically non-conductive (dielectric) substrate. It is readily understood that the exterior surface of a cylinder is a 3-D surface. The semiconductor material can be polycrystalline or amorphous, for example, and can have any convenient or useful thickness allowing the film, as formed on the substrate surface, to maintain its integrity. The semiconductor coil(s) is formed on the substrate using any of various techniques for forming semiconductor films.

A particularly useful semiconductor material for use in the coil units is any of various photoconductors, including but not limited to photoconductive organic compounds, photoconductive silicon, photoconductive mixtures and compounds including at least one semiconductor, and graphene. A photoconductor produces electrical current whenever the material, while being subjected to a voltage drop, is being illuminated by one or more appropriate wavelengths of light. The electrical current can be due to propagation of conduction electrons of normal mass and also to propagation of conduction electrons having lower than normal mass. Depending upon the specific material, these so-called low-mass electrons are mobilized by illumination to carry a current. In some instances, the low-mass electrons are produced spontaneously by the material under particular environmental conditions.

After forming the film of semiconductor material on the surface of the substrate, selected regions of the semiconductor material are removed to form the remaining regions of the semiconductor film into one or more coils on the substrate surface. Selective removal can be by, for example, abrasion, machining, selective etching, or laser ablation. Abrasion can be performed manually, using a narrow abrasive or cutting tool or an automated cutting machine. Laser ablation can be achieved using a laser beam directed onto the substrate surface, wherein the laser, the substrate, or both are moved as the laser ablates material in locations in which the laser beam is incident. As a result of this selective removal, corresponding regions of the layer of semiconductor on the cylindrical surface of the substrate are removed so that remaining portions of the semiconductor film define a coil (e.g., circular or helical) on the substrate surface. For example, the film of semiconductor material can be formed into a film-like helical coil by removing a complementary-shaped helical region of the semiconductor from the surface. After such selective removal of semiconductor material, the remaining semiconductor on the substrate surface is configured as an in situ band of semiconductor having a helical or other 3-D shape on the substrate. At the conclusion of this selective removal of semiconductor film, the semiconductor coil thus formed typically comprises multiple turns or "windings" and has an external surface.

After forming the coil of semiconductor material on the surface of the substrate, at least one coil of an electrically conductive metal is formed on, applied to, fitted to, or otherwise attached to the external surface of the semiconductor coil. Regarding the specific material of which the coil of conductive metal is formed, the only general criterion is that the metal and semiconductor material should not be reactive with each other. Otherwise, one or both coils may experience substantial degradation from co-reaction. Consequently, stainless steel is an advantageous material from which to fabricate the metal coil. In many embodiments the metal coil has the same pitch as the semiconductor coil, and thus each loop of the metal coil is registered with a corresponding loop of the semiconductor coil. In situ, the metal coil desirably contacts the underlying semiconductor coil, although in some embodiments the metal coil can be prevented from contacting the semiconductor coil by, for example, interposing one or more layers of dielectric between the metal coil and the underlying semiconductor coil. (The metal coil can be made of a material that is otherwise reactive with the semiconductor material if a film of dielectric is interposed between the metal coil and the semiconductor coil.) To make a relatively stiff strip of metal conform closely to the semiconductor coil, the metal strip can be formed separately and pre-curled to a smaller diameter than the diameter of the semiconductor coil before applying the coil to the external surface of the semiconductor coil. In any event, the metal coil is positioned sufficiently closely to the semiconductor coil for the windings of the metal coil to produce, when the coils are energized, Coulombic drag in the corresponding windings of the semiconductor coil.

Coil units made as described above overcome the conventional difficulty of forming a coil of semiconductor material directly on the surface of a coil of conductive metal.

Fabricating a coil unit typically begins by applying or forming a layer (or superposed stack of layers) of at least one semiconductor material on (or at least defined by) the outer surface of the substrate. If the semiconductor layer comprises multiple layers of semiconductor material, these layers can be all similar to each other or can be different from each other from a compositional standpoint, a configurational standpoint, or both. The layer(s) can be formed by any of various suitable methods such as, but not limited to, chemical bath deposition, chemical vapor deposition, spraying (e.g., of graphene), or any of various techniques for applying a slurry of fine crystals of the semiconductor material. If the semiconductor material is applied as a slurry to the substrate surface, the carrier liquid of the slurry is removed afterward (e.g., by heating in an oven), followed by sintering, if required, of the remaining semiconductor material. If the desired film thickness cannot be obtained by execution of one film-forming protocol, the protocol may be repeated as necessary to produce the desired film thickness of semiconductor material. The interior surface of the substrate desirably is not coated with the semiconductor material to avoid having a second semiconductor film to contend with that could have uncontrolled currents that counter the intended currents.

The semiconductor material can be applied over the entire outside surface of the substrate, followed by removal, as described above, of the semiconductor material from selected regions to form the remaining semiconductor material on the substrate surface into one or more coils. Desirably, the selective removal of semiconductor is performed over the full length of the substrate, which facilitates providing the coil units with features permitting coupling of multiple coil units together for use in an electrical apparatus. In some electrical apparatus multiple coil units (e.g., two, four, six, or eight) are coupled (and connected) together to form the semiconductor and metal coils into respective closed-loop circuits.

Coil Substrate

For use in forming a coil unit, a substrate generally having a cylindrical or near-cylindrical shape is convenient. Alternatively, the substrate can have any of various other shapes (e.g., rectangular) for particular applications. The substrate is fabricated of any of various rigid, inert materials that desirably are transparent to the photo-excitation wavelength(s) with which the coil will be used (particularly if photo-excitation is to be achieved from inside the lumen of the substrate). The substrate also is electrically non-conductive, i.e., it is fabricated of a dielectric material or comprises one or more dielectric layers on which the coils are formed or applied. An exemplary substrate is fabricated from a dielectric material such as borosilicate glass, rigid polymer, or other suitable material.

A representative embodiment of a cylindrical substrate 10 is shown in FIG. 1. The substrate 10 has a first end 12, a second end 14, and a 3-D substrate surface 16 extending therebetween. Desirably, the substrate surface 16 has a constant diameter over its length. In this embodiment the second end 14 includes an end portion (generally called a "flange") 18 having a larger diameter than either the first end 12 or the substrate surface 16. The presence of the flange 18 on the second end 14 but not on the first end 12 facilitates the coupling together of adjacent coil units in a manner that also results automatically in corresponding end-to-end connection of the respective semiconductor coils and respective conductive metal coils of the coil units.

First Embodiment of Coil Unit

Figure 2:
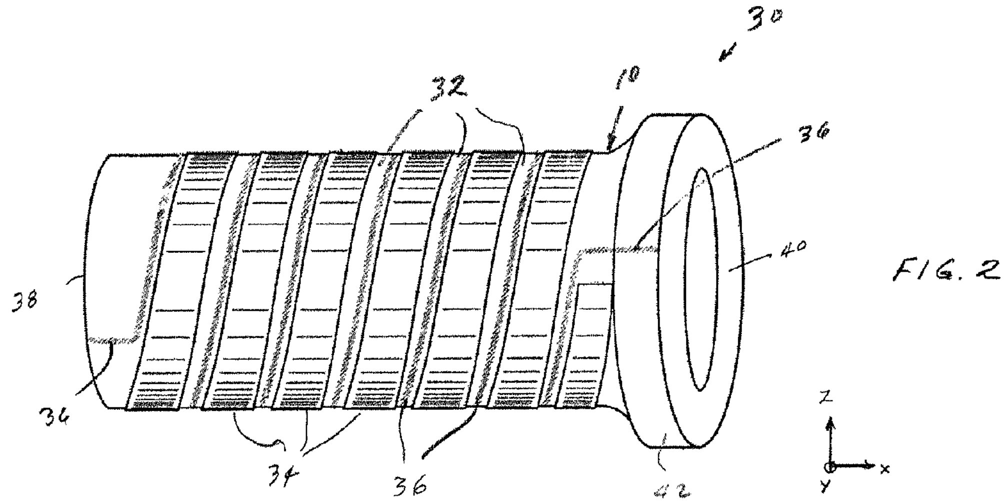
FIG. 2 is a dimetric drawing showing the substrate of FIG. 1 on which a 3-D helical coil of semiconductor material has been formed, followed by disposition of a corresponding conductive-metal coil on the surface of the semiconductor coil, thereby forming an embodiment of a 3-D coil unit.

A representative embodiment of a coil unit 30 is shown in FIG. 2. The coil unit 30 comprises a non-conductive substrate 10 as described above, a first coil 32 made of a semiconductor material, and a second coil 34 made of a conductive metal. The substrate 10 has a cylindrical outer surface, which is an exemplary 3-D surface on which the coils 32, 34 are formed. The first coil 32 is fabricated separately from any metal by directly forming a film of semiconductor material on the outer surface of the substrate 10, as described above, followed by selective removal of a helically shaped region 36 of the film. Semiconductor material can be removed from the region 36 using a narrow abrasive instrument or by laser ablation, for example, leaving a separation in the semiconductor film that forms a helical pattern of remaining semiconductor material from one end of the substrate to the other. The region 36 of removed material winds around the substrate 10 and extends from the first end 38 to the second end 40 thereof, including onto the flange 42. Thus, the region 36 defines the remaining semiconductor layer as a helical first coil 32 of semiconductor wound around the outer surface of the substrate. The first coil 32 has an outer surface. The second coil 34, made of a conductive metal, is disposed on the outer surface of, and coextensively with, the first coil 32. Thus, both coils 32, 34 are situated on the outer surface of the substrate and have respective helical configurations characterized by multiple windings around the substrate.

Although FIG. 2 depicts the first and second coils 32, 34 having substantially the same pitch, this is not intended to be limiting. If desired or required, one coil can have a different pitch than the other coil. Also, although FIG. 2 depicts the first and second coils having windings having substantially equal respective widths in the axial direction, this is not intended to be limiting. If desired or required, the second coil 34 can have narrower windings than the first coil 32. Narrower windings of the second coil 34 are of particular utility if the semiconductor material of the first coil 32 is a photoconductor, wherein the narrower windings of the second coil allow substantial regions of the first coil to receive photo-conduction or -stimulating light. I.e., narrower windings of the second coil 34 prevent excessive blockage of the first coil 32 by the second coil. Although FIG. 2 depicts the first and second coils 32, 34 having substantially equal pitch over the axial length of the coil unit 30, this is not intended to be limiting. Either coil or both coils 32, 34 can have variable pitch. Although FIG. 2 depicts the second coil 34 as being one layer of windings, this not intended to be limiting. The windings of the second coil alternatively can be in more than one layer.

The windings of the second coil 34, made of conductive metal, can be formed by simply winding a wire, tape, or strip of the subject metal circumferentially around the substrate on the first coil in a helical manner. This winding can be done by hand or by machine. Alternatively, for example, the second coil 34 can be formed separately and then fitted (e.g., slipped) onto the substrate over the first coil. Again, this can be performed manually or by machine. It is also conceived that the second coil can be applied or fowled in situ so long as the particular in situ method does not damage the first coil 32. The windings of metal and of semiconductor material desirably extend over substantially the entire length of the substrate. At the ends of the substrate, the windings of the first coil desirably diverge as required to place the respective ends of the windings in respective locations on or near the ends of the substrate to facilitate automatic electrical connection of respective semiconductor coils as multiple coil units are coupled together (e.g., in parallel) into a coil assembly. In a coil assembly a metal strip or metal "jumper" can be used to connect together the respective metal coils of adjacent coil units. Clip fasteners, small rivets, or small bolts can be used to connect the jumpers to the ends of the metal coils.

In general, precise placement of the windings of the second coil relative to the windings of the first coil is unnecessary. The main criterion regarding coil placement is that the windings of the second coil be in sufficiently close proximity to the windings of the first coil for the second coil to produce Coulombic drag of electrons flowing in the first coil, as urged by flow of electrons in the second coil. As noted above, actual physical contact between the first and second coils is normally not an issue. (However, in some applications, there is no actual contact between the metal coil and semiconductive coil; contact can be prevented by interposing one or more layers of a dielectric between the first and second coils.)

Second Embodiment of Coil Unit

Figure 3A:
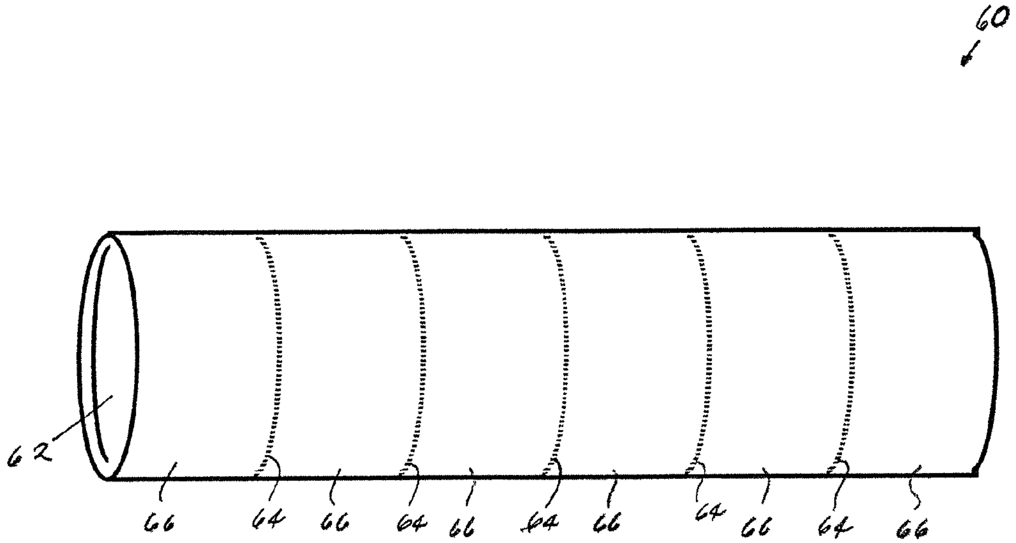
FIG. 3A is a dimetric drawing of an alternative configuration of a cylindrical substrate on which a film of semiconductor material (particularly photoconductive material) has been formed, followed by selective removal of multiple ring-shaped regions of the semiconductor film to form a series of corresponding ring-shaped coils of the semiconductor on the cylindrical substrate surface.
Figure 3B:
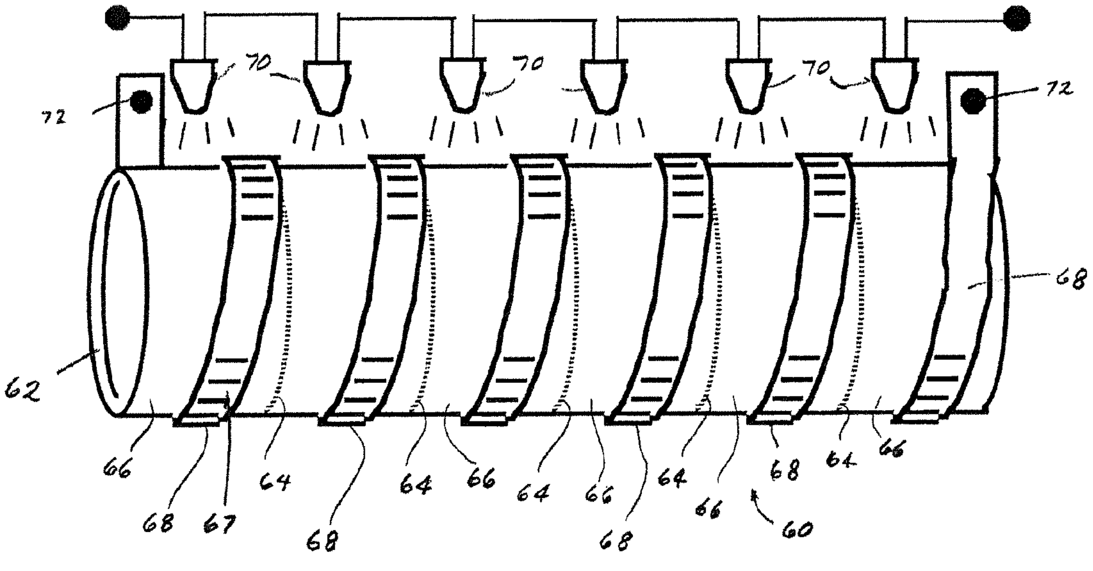
FIG. 3B is a dimetric drawing of the substrate of FIG. 3A on which a helical coil of metal has been disposed on the cylindrical surfaces of the semiconductor coils. This drawing also depicts an exemplary manner in which the photoconductive material can be illuminated using a series of LEDs.

In this embodiment 60, shown in FIGS. 3A-3B, the outer surface of a cylindrical (3-D) substrate 62 of dielectric material is coated with a semiconductor material as described in the first embodiment. Narrow, circular bands 64 of the semiconductor material are removed from the substrate 62 by abrasion or by laser ablation, for example, leaving multiple rings 66 of the semiconductor encircling the substrate 62. (Each of these rings 66 can be regarded as a respective one-loop coil.) A narrow strip of a non-reactive metal, such as stainless steel, is wound or otherwise disposed in a helical fashion on the surface of the semiconductor rings 66. The resulting metal coil 67 desirably extends from one end of the substrate 62 to the other, thereby covering part of each ring 66 of semiconductor material. In instances in which the semiconductor is a photoconductor, the metal strip 68 desirably is sufficiently narrow so that a significant portion of each semiconductor ring 66 can receive excitation photons from illumination sources such as nearby LEDs 70 producing a desired wavelength of light directed at the semiconductor ring-shaped coils.

When incorporating this embodiment of a coil unit into an electrical apparatus, a "sending" coil (not shown) of the apparatus can be situated alongside and parallel to the coil unit 60. Additional coil units 60 can be arranged that are all parallel to each other and that radially surround the sending coil to induce oscillations in the metal coils of the coil units.

In an alternative configuration, the metal coil 67 of this embodiment can be used directly as a sending coil without having to utilize a second coil for this purpose. An oscillating electric current fed into the metal coil 67 exerts Coulombic drag on the rings 66 of semiconductor material. The electric oscillations in the semiconductor rings 66, in turn, can be used to induce electric oscillations in an output coil (not shown). The ends of the metal coil 67 are provided with holes 72 to facilitate interconnection (using conductive jumpers, for example, (not shown)).

Interconnection of Multiple Coil Units in a Coil Assembly

Figure 4:
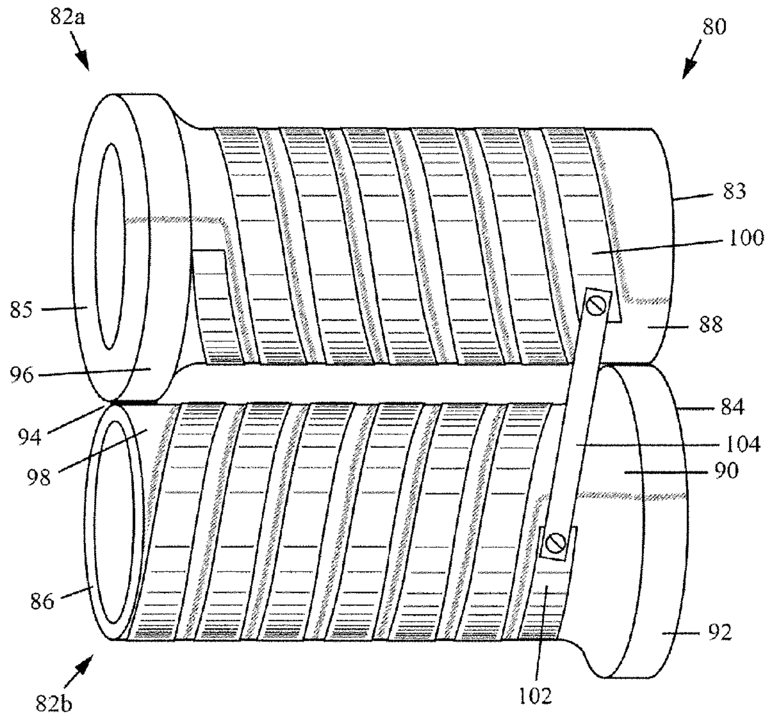
FIG. 4 is a dimetric drawing showing two coil units as shown in FIG. 2 coupled together and electrically connected together, as facilitated by a flange feature on one end of each coil assembly.

FIG. 4 depicts an embodiment of a coil assembly 80 comprising first and second coil units 82*a*, 82*b* situated adjacent each other such that the first end 83 of the first coil unit 82*a* is positioned adjacent the second end 84 of the second coil unit 82*b*, and the second end 85 of the first coil unit 82*a* is positioned adjacent the first end 86 of the second coil unit 82*b*. This arrangement allows easy electrical connection of adjacent semiconductor coils with each other (by semiconductor-to-semiconductor contact) and, in certain embodiments, easy electrical connection of adjacent metal coils with each other. Specifically, a first end 88 of the semiconductor coil of the first coil unit 82*a* is connected to the second end 90 of the semiconductor coil of the second coil unit 82*b* simply by lateral contact of the flange 92 of the second coil unit 82*b* with the first end 88 of the first coil unit 82*a*. If desired, such contact on the opposite end of the coil assembly 80 can be prevented by placing a piece 94 of dielectric material between the flange 96 of the first coil unit 82*a* and the first end 98 of the second coil unit 82*b*. Meanwhile, in this embodiment, the end 100 of the metal coil of the first coil unit 82*a* and the end 102 of the metal coil of the second coil unit 82*a* are electrically connected together using a conductive jumper 104. The jumper 104 can be secured to the ends 100, 192 of the metal coils by brazing (e.g., soldering), welding, or use of any of various fasteners, rivets, or bolts. Additional coil units (not shown) can be connected to the pair shown in FIG. 4 in a similar manner, thereby providing respective series connections of multiple metal coils and multiple semiconductor coils.

In FIG. 4, the metal coils are indicated by the helical, shaded bands. The abraded or ablated line that defines the helical coils of semiconductor material on the surfaces of the substrate is indicated by a thick dashed line.

Figure 5:
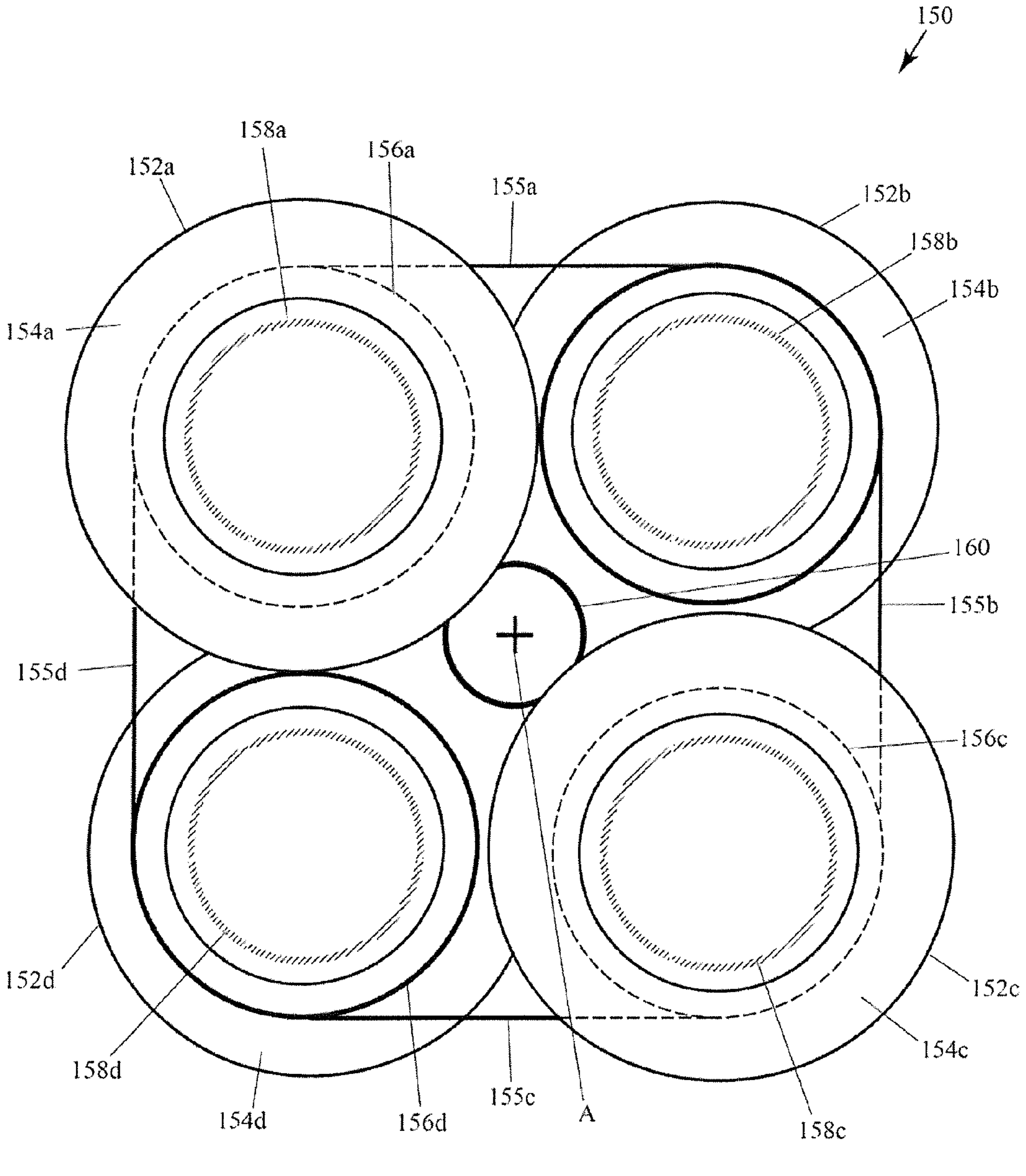
FIG. 5 is an end view of four coil units as shown in FIG. 2 coupled and connected together to form a power supply device.

FIG. 5 is an end view of a coil assembly 150 comprising four coil units 152*a*, 152*b*, 152*c*, 152*d* as shown in FIG. 2, or two coil assemblies as shown in FIG. 4, depicting a representative manner in which coil assemblies can be constructed that occupy minimal volume while placing multiple coil units 152*a*-152*d* as close as possible to each other for spatial and operational efficiency. Specifically, efficiency is realized by arranging the coil units 152*a*-152*d* parallel to each other and radially arranged about a central axis A to which the coil units are parallel. Visible in his drawing are the flanges 154*a*, 154*c* of the first and third coil units 152*a*, 152*c*, respectively, and the flanges 154*b*, 154*d* of the second and fourth coil units 152*b*, 154*d*, respectively. The flanges 152*a*, 152*c* are situated closer to the viewer than the flanges 152*b*, 152*d*. Also visible are the conductive metal jumper 155*a* connecting together the wire coils 156*a*, 156*b* in the first and second coil units 152*a*, 152*b*, the conductive metal jumper 155*b* connecting together the wire coils 156*b*, 156*c* in the second and third coil units 152*b*, 152*c*, the conductive metal jumper 155*c* connecting together the wire coils 156*c*, 156*d* in the third and fourth coil units 152*c*, 152*d*, and the conductive metal jumper 155*d* connecting together the wire coils 156*d*, 156*a* in the fourth and first coil units 152*d*, 152*a*. The respective semiconductor coils are interconnected in series in the closed manner shown in FIG. 4 and discussed above. For conduction of low-mass electrons, it is critical that the semiconductor coils be connected together in a closed series manner.

If desired or required, respective output coils 158*a*-158*d* can be inserted axially into the lumens of the cylindrical substrates. Also, a respective sending coil 160 can be nested inside the assembly 150 of four coil units along the axis A of the assembly, parallel to each of constituent coil units 152*a*-152*d*.

Third Embodiment of Coil Unit

Figure 6A:
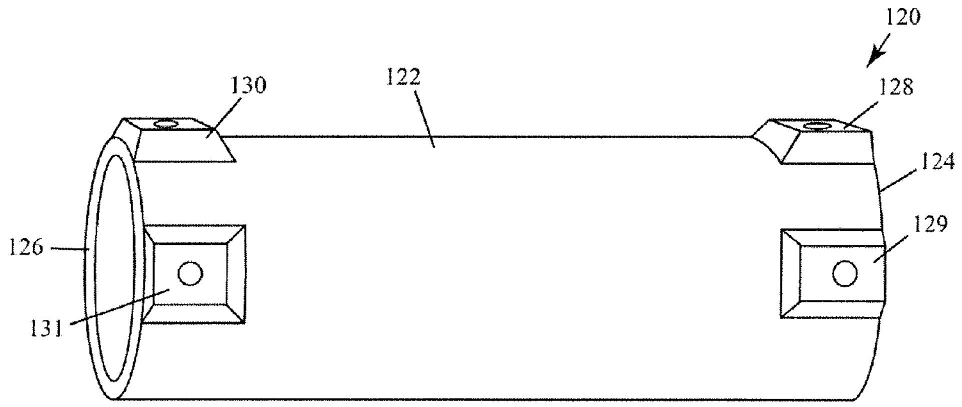
FIG. 6A is a dimetric drawing showing an alternative embodiment of a substrate for a coil unit.
Figure 6B:
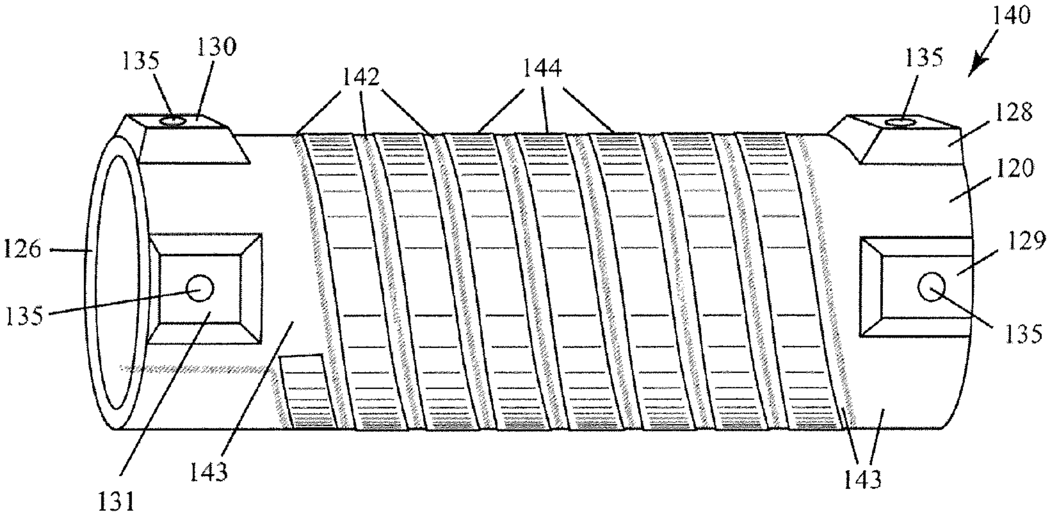
FIG. 6B is a dimetric drawing of the substrate of FIG. 6A on which a helical coil of semiconductor material and helical coil of conductive metal has been formed, according to a second embodiment of a coil unit.

A third embodiment 120 of a coil unit is depicted in FIGS. 6A and 6B. In FIG. 6A, the substrate 122 of this coil unit 120 is cylindrical, having a first end 124 and a second end 126. Each first end 124 includes one or more raised portions 128, 129, and each second end 126 includes one or more raised portions 130, 131 (two are shown on each end). Each raised portion 128, 129 on the first end 124 has a corresponding raised portion 130, 131 axially aligned with it on the second end 126.

A coil unit 140 including the substrate of FIG. 6A is shown in FIG. 6B. Shown are the abrasion line 142 that defines the helical windings of the semiconductor coil 143. Also shown are the windings 144 of the metal coil and the raised portions 128-131.

Figure 6C:
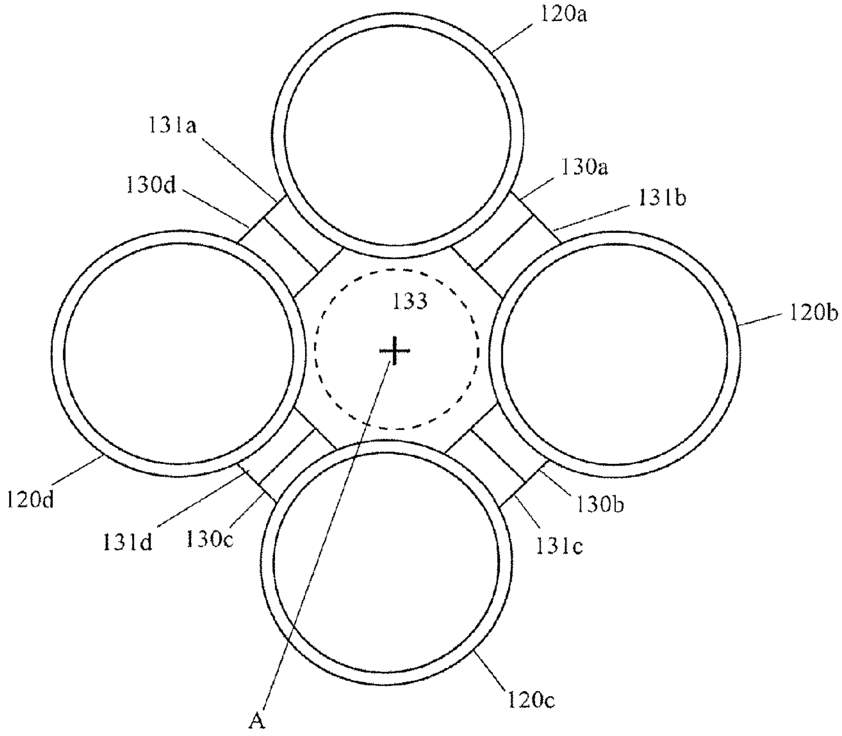
FIG. 6C is an end view of four coil units as shown in FIG. 6B coupled together in a radial manner about an axis A.

The opposed raised portions 128-131 facilitate mechanical coupling of adjacent coil units together. For example, as shown in FIG. 6C, four coil units 120*a*-120*d* are shown coupled to each other using the raised portions 128, 129, 130, 131 (spaced 90° apart) on each end of each coil unit. On each end of each coil unit, at least one raised portion is connected to one end of the semiconductor coil. As a result, when the coil units are assembled into a four-coil assembly as shown, the respective semiconductor coils are automatically connected together head-to-tail, which can be used to form a closed-loop circuit of the four semiconductor coils. The assembly desirably is radial about a central axis A to which the coil units are parallel. It is possible to connect the wire coils together using metal jumpers as described above or to use the second raised portion on each end of each coil unit to connect the wire coils together automatically when assembling the coil units together. In either event, the four-coil arrangement includes a central void 133 (extending along the axis A) in which another coil (e.g., a sending coil) can be disposed.

Each raised portion in this embodiment includes a hole 135 that can receive a bolt (desirably of nylon or the like) or other fastener to hold the coil units together in the assembly. The holes can be replaced with slots or the like for easier assembly. Clip fasteners can be used instead of bolts.

Although FIG. 6C depicts a coil assembly comprising four coil units, this is not intended to be limiting. Closed-loop circuits can be formed by arranging any even-number of coil units in this radial manner to form respective circuits including multiple semiconductor coils and conductive-metal coils. The number of coil units that can be assembled in a radial assembly is determined mainly by the radial angle between the raised portions. A radial angle of 90°, as shown in the figure, between the raised portions allows four coil assemblies to be assembled. A radial angle of 135° allows for eight coil assemblies to be assembled.

In the arrangement shown in FIG. 6C, the semiconductor coils of all the coil units are connected together in series in a close-loop manner if the circuit is to be used for conducting low-mass electrons. Low-mass conduction electrons typically have large drift velocities. If a break were to occur in the semiconductor coils during use in certain applications, charges would accumulate almost instantly at the break rather than being distributed as desired throughout the semiconductor coils. The substrates provided excellent physical support for the semiconductor coils and thus for the conductive-metal coils.

Low-Mass Electrons

Under certain conditions in certain materials, conduction electrons possess less inertial mass than normal conduction electrons. An electron having less than normal mass can experience an acceleration from application of a force that is greater than the acceleration experienced by a normal-mass electrons subjected to the same force. According to Larmor, the radiation of inductive photons is proportional to the square of the acceleration of moving electric charge (e.g., electrons):

$$E = \frac{2e^2}{3c}\alpha^2$$

Larmor (1897), "On the Theory of Magnetic Influence of Spectra and on the Radiation from Moving Ions," *Phil. Mag.* 63:503-578. Exemplary materials capable of producing electrons of sub-normal mass include semiconductors, photoconductors, and superconductors. Low-mass electrons are also produced by certain other materials including, but not limited to, photoconductive organic compounds, photoconductive silicon, and carbon in the form of graphene. Low-mass conduction electrons in these materials typically exhibit high mobility and high drift velocities. For example, the drift velocity of low-mass conduction electrons in the semiconductor GaN is approximately 100 km/s. Rodrigues (2006), "Electron Drift Velocity in n-Doped Wurtzite GaN," *Chin. J. Phys.* 44:44-50. The drift velocity of low-mass conduction electrons in graphene is approximately 1000 km/s. The drift velocities of normal-mass conduction electrons are typically less than 1 cm/s, but all the normal-mass conduction electrons drift with each other.

Inductive forces are conveyed between adjacent metal conductors by directional photons rather than by magnetic fields. This is revealed by the fact that magnets of appropriate polarity can attract each other through aluminum foil, whereas aluminum foil can block an inductive force otherwise established between coils such as nested coils. Because of the low concentration of low-mass conduction electrons in many semiconductors, in contrast to the very high concentrations of normal-mass conduction electrons in metals, inductive photons may not directly induce electrical oscillations in many semiconductors. This is not a problem where a thin film of semiconductor material is formed in situ on a metal wire, such as lead sulfide formed chemically on wire made of lead. Electrical oscillations induced in the metallic wire are conveyed to the lead sulfide film from the oscillating electric current in the metal by Coulombic drag.

Use of Coil Units in a Power Supply

Figure 7:
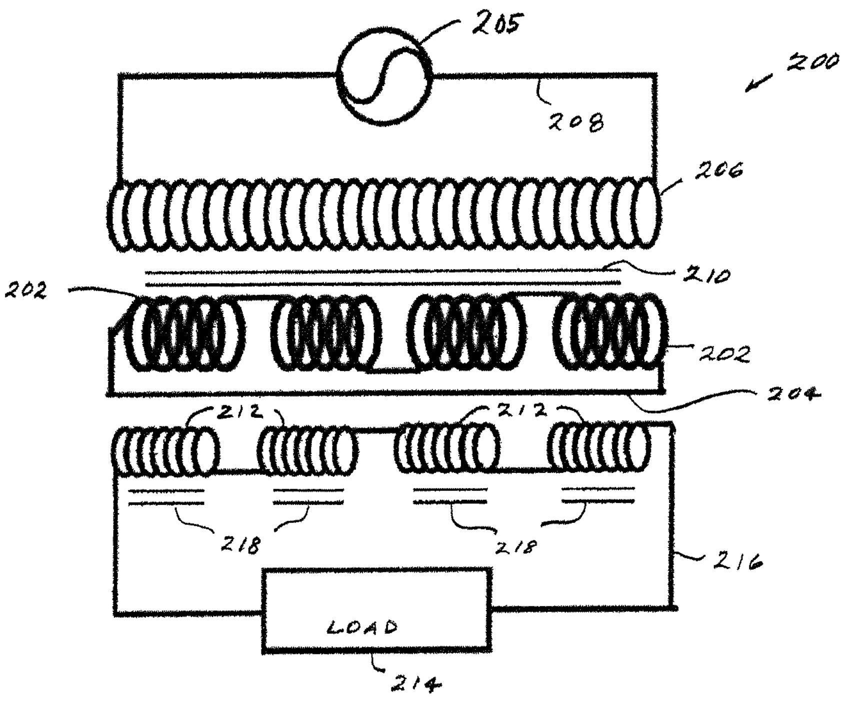
FIG. 7 is an electrical schematic diagram of a power supply apparatus comprising at least one coil unit.

An embodiment of a power-supply apparatus 200 comprising four coil units 202 is shown in FIG. 7. The coil units 202 are connected together in series in a closed loop circuit 204. The apparatus 200 also includes a sending coil 206 (also called a central coil) connected to an oscillating electric power source 205 in a closed-loop circuit 208. If desired or required, the sending coil 204 may have a ferrous or ferrite core 210. The apparatus 200 also includes four output coils 212 interconnected in series with each other and with a load 214 in a close-loop circuit 216. The output coils 212 desirably are nested coaxially inside respective coil units 202 and can include individual ferrous or ferrite cores 218. Application of an oscillating current from the electrical power source 205 to the central coil 206 induces corresponding oscillating currents in the metal coils of the coil units 202. The oscillating electric currents in the metal coils are conveyed to the respective semiconductor coils of the coil units 202 by Coulombic drag. If photoconduction is needed to produce low-mass electrons in the semiconductor coils of the coil units 202, the semiconductor coils comprise a photoconductor, and appropriate photo-excitation is provided to exposed regions of the photoconductive coils of the coil units 202.

Photon-induced energy from the semiconductor coils of the coil units 202 is conveyed to the coils 212, which can be made of ordinary conductive wire, used as output coils. As noted, the output coils 212 desirably are coaxially nested inside respective coil units 202. The output coils 212 can be electrically connected together in series (as shown) or in parallel for performing useful work in the load 214. Alternatively, they can be wired independently.

Example

In this example, four coil units, each being 4 inches in length and 1.5 inches in diameter, were prepared. The semiconductor coils in each coil unit comprised films of cadmium sulfide (CdS) on cylindrical glass tubes. Two of the coil units had relatively thick CdS films that exhibited measurable photoconduction. The CdS coils of the other two coil units did not exhibit photoconduction but were still sufficiently conductive of low-mass electrons to complete a closed-loop circuit through the CdS coils of all four coil units. On all four coil units, the helical semiconductor coils had overlying respective metal coils. Each metal coil, made of thin, stainless steel strip formed into a helix that matched the helix of the respective CdS coil, was fitted onto the respective CdS coil. The metal coils were connected together to form a closed-loop circuit. The four coil assemblies were coupled together in a radial arrangement as shown in FIG. 6C. Disposed centrally in the arrangement was a "sending" coil, 3.5 inches in length, comprising ordinary insulated wire and a ferromagnetic core. Nested in each coil assembly was a corresponding wire coil 3.5 inches in length, each having a respective ferromagnetic core. The coils were connected electrically in series with each other, and a resistive load of 50 ohms was connected into the circuit. No outside electric power was applied to the wire-coil circuit.

A sinusoidal 1-kHz current was supplied by a function generator to the central coil, to which a 50-ohm resistance was connected. After 15 minutes of darkness to eliminate any persistent photo-conductance in the semiconductor-metal coils, the output power produced by the apparatus in the dark was determined. The output power, calculated from voltage measurements using the equation: volt-amps=$V^2/R$, was 43% of the input power.

Then, the four semiconductor-metal coils of the apparatus were exposed to normal room illumination, of which most of the energy was outside the photo-excitation curve of CdS. Most of the CdS that was illuminated was at the ends of the semiconductor-metal coils. All other conditions were the same as in the dark. Under illumination the output power, determined from volt-amps=$V^2/R$, increased to 3.0 times input power. Thus, illumination increased the 1-kHz output by a factor of seven.

To test this output against a known added illumination received by the apparatus, a single 507-nm LED rated at 3.7 V and 20 milliamps (74 mW) was used to illuminate an otherwise darkened apparatus at one tube end, with most of the light passing through the CdS. The illumination that was intercepted from the LED by the photoconductor had increased the output power by 1.4 times over the power supplied by the LED.

Since the apparatus was not shielded, the metal coils of the apparatus also acted as receiving antennae for stray 60-Hz and 47-kHz radiation from nearby electronic instruments and electrical equipment in use. The output power of 60-Hz frequency under illumination conditions was, relative to the 60-Hz output power in darkened conditions increased by a factor of 2.6. Since the 47-kHz output obtained in illuminated conditions was increased over the output power in dark conditions by a factor of 13, it was concluded that output power increased with corresponding increases in oscillation frequency.

Whereas the invention has been described in connection with representative embodiments, it will be understood that it is not limited to those embodiments. On the contrary, it is intended to encompass all alternatives, modifications, and equivalents as may be included within the spirit and scope of the invention as defined by the appended claims.

What is claimed is:

1. A coil unit, comprising:

a rigid substrate having an electrically non-conductive three-dimensional (3-D) surface;

at least one 3-D coil of semiconductor material formed on the substrate surface; and a 3-D coil of a conductive metal disposed on the at least one coil of semiconductor material, wherein the coil of conductive metal is situated sufficiently closely to the at least one coil of semiconductor material for the coil of conductive metal to produce Coulombic drag in the at least one coil of semiconductor material when the coils are conductive of low-mass electrons.

2. The coil unit of claim 1, wherein the semiconductor material comprises a photoconductor.

3. The coil unit of claim 2, wherein the coil of conductive metal is disposed on the at least one coil of semiconductor material in a manner maintaining a portion of the at least one coil of semiconductor material exposable to photoconduction-inducing light from an illumination source.

4. The coil unit of claim 1, wherein at least one coil of semiconductor material is helical about the substrate on the substrate surface.

5. The coil unit of claim 4, wherein the coil of conductive metal is co-helical with the helical coil of semiconductor material about the substrate on the substrate surface.

6. The coil unit of claim 1, wherein:

the coil of conductive metal is helical about the substrate on the substrate surface; and the at least one coil of semiconductor material comprises multiple ring coils.

7. The coil unit of claim 1, wherein the coil of conductive metal electrically contacts the coil of semiconductor material on the substrate surface.

8. The coil unit of claim 1, wherein the coil of conductive metal is electrically insulated from the at least one coil of semiconductor material on the substrate surface.

9. The coil unit of claim 1, wherein:

the substrate is configured as a cylinder having first and second ends; and each of the first and second ends includes at least one respective raised portion electrically connected to the at least one coil of semiconductor material to provide a semiconductor-to-semiconductor connection of the at least one semiconductor coil of a first coil unit with an at least one semiconductor coil of a second coil unit coupled by the raised portions to the first coil unit.

10. The coil unit of claim 9, wherein each first and second end includes multiple raised portions arranged for coupling multiple coil units together in a radial array using the raised portions.

11. The coil unit of claim 1, wherein:

the substrate is configured as a cylinder having a diameter and first and second ends; and the second end includes a flange having a diameter greater than the diameter of the cylinder, the flange providing a contact electrically connected to the at least one coil of semiconductor material to provide a semiconductor-to-semiconductor connection of the at least one semiconductor coil of a first coil unit with an at least one semiconductor coil of a second coil unit coupled head-to-tail in parallel with the first coil unit.

12. A coil assembly, comprising multiple coil units as recited in claim 1 coupled together.

13. The coil assembly of claim 12, comprising an even number of coil units coupled together, wherein the respective at least one semiconductor coils of the coil units are electrically connected to each other and the respective conductive-metal coils are electrically connected to each other.

14. The coil assembly of claim 13, wherein the respective coils of the coil units are connected together in series.

15. The coil assembly of claim 13, wherein the respective coils of the coil units are connected together as a closed loop.

16. The coil assembly of claim 13, wherein the respective coils of the coil units are connected together in parallel.

17. The coil assembly of claim 12, further comprising a central coil, wherein the multiple coil units are coupled together in a radial arrangement relative to and parallel to the central coil.

18. An electrical circuit, comprising:

multiple coil units arranged radially relative to an axis, each coil unit comprising a rigid substrate having an electrically non-conductive three-dimensional (3-D) surface, at least one 3-D coil of semiconductor material formed on the substrate surface, and a 3-D coil of a conductive metal disposed on the at least one coil of semiconductor material, wherein the coil of conductive metal is situated sufficiently closely to the at least one coil of semiconductor material for the coil of conductive metal to produce Coulombic drag in the at least one coil of semiconductor material when the coils are conductive of low-mass electrons;

a respective output coil nested coaxially in each coil unit, each output coil being inductively coupled to the respective coil unit; and a central coil situated on the axis relative to the coil units so that the coil units are radially disposed relative to the central coil, the coil units being inductively coupled to the central coil.

19. The electrical circuit of claim 18, wherein the semiconductor material comprises a photoconductive material, the circuit further comprising illumination means for illuminating the photoconductive material as oscillations are being stimulated in the coil units.

20. An electrical circuit, comprising:

multiple coil units arranged radially relative to an axis, each coil unit comprising a rigid, cylindrical substrate having first and second ends and an electrically non-conductive three-dimensional (3-D) surface, at least one 3-D coil of semiconductor material formed on the substrate surface, and a 3-D coil of a conductive metal disposed on the at least one coil of semiconductor material, wherein the coil of conductive metal is situated sufficiently closely to the at least one coil of semiconductor material for the coil of conductive metal to produce Coulombic drag in the at least one coil of semiconductor material when the coils are conductive of low-mass electrons;

a respective output coil nested coaxially in each coil unit, each output coil being inductively coupled to the respective coil unit; and a central coil situated on the axis relative to the coil units so that the coil units are radially disposed relative to the central coil, the coil units being inductively coupled to the central coil.

21. The electrical circuit of claim 20, wherein the semiconductor material comprises a photoconductive material, the circuit further comprising illumination means for illuminating the photoconductive material as oscillations are being stimulated in the coil units.

22. A coil unit, comprising:

a rigid substrate having an electrically non-conductive three-dimensional (3-D) surface;

at least one 3-D coil of semiconductor material formed on the substrate surface; and a 3-D coil of a conductive metal disposed on the at least one coil of semiconductor material such that the coil of conductive metal electrically contacts the coil of semiconductor material on the substrate surface.

23. The coil unit of claim 22, wherein the semiconductor material comprises a photoconductor.

24. The coil unit of claim 23, wherein the coil of conductive metal is disposed on the at least one coil of semiconductor material in a manner maintaining a portion of the at least one coil of semiconductor material exposable to photoconduction-inducing light from an illumination source.

25. The coil unit of claim 22, wherein at least one coil of semiconductor material is helical about the substrate on the substrate surface.

26. The coil unit of claim 25, wherein the coil of conductive metal is co-helical with the helical coil of semiconductor material about the substrate on the substrate surface.

27. The coil unit of claim 22, wherein:

the coil of conductive metal is helical about the substrate on the substrate surface; and the at least one coil of semiconductor material comprises multiple ring coils.

28. The coil unit of claim 22, wherein:

the substrate is configured as a cylinder having first and second ends; and each of the first and second ends includes at least one respective raised portion electrically connected to the at least one coil of semiconductor material to provide a semiconductor-to-semiconductor connection of the at least one semiconductor coil of a first coil unit with an at least one semiconductor coil of a second coil unit coupled by the raised portions to the first coil unit.

29. The coil unit of claim 28, wherein each first and second end includes multiple raised portions arranged for coupling multiple coil units together in a radial array using the raised portions.

30. The coil unit of claim 22, wherein:

the substrate is configured as a cylinder having a diameter and first and second ends; and the second end includes a flange having a diameter greater than the diameter of the cylinder, the flange providing a contact electrically connected to the at least one coil of semiconductor material to provide a semiconductor-to-semiconductor connection of the at least one semiconductor coil of a first coil unit with an at least one semiconductor coil of a second coil unit coupled head-to-tail in parallel with the first coil unit.

31. A coil assembly, comprising multiple coil units as recited in claim 22 coupled together.

32. The coil assembly of claim 31, comprising an even number of coil units coupled together, wherein the respective at least one semiconductor coils of the coil units are electrically connected to each other and the respective conductive-metal coils are electrically connected to each other.

33. The coil assembly of claim 32, wherein the respective coils of the coil units are connected together in series.

34. The coil assembly of claim 32, wherein the respective coils of the coil units are connected together as a closed loop.

35. The coil assembly of claim 32, wherein the respective coils of the coil units are connected together in parallel.

36. The coil assembly of claim 31, further comprising a central coil, wherein the multiple coil units are coupled together in a radial arrangement relative to and parallel to the central coil.

37. An electrical circuit, comprising:

multiple coil units arranged radially relative to an axis, each coil unit comprising a rigid substrate having an electrically non-conductive three-dimensional (3-D) surface, at least one 3-D coil of semiconductor material formed on the substrate surface, and a 3-D coil of a conductive metal disposed on the at least one coil of semiconductor material such that the coil of conductive metal electrically contacts the coil of semiconductor material on the substrate surface;

a respective output coil nested coaxially in each coil unit, each output coil being inductively coupled to the respective coil unit; and a central coil situated on the axis relative to the coil units so that the coil units are radially disposed relative to the central coil, the coil units being inductively coupled to the central coil.

38. The electrical circuit of claim 37, wherein the semiconductor material comprises a photoconductive material, the circuit further comprising illumination means for illuminating the photoconductive material as oscillations are being stimulated in the coil units.

39. A coil unit, comprising:

a rigid substrate having an electrically non-conductive three-dimensional (3-D) surface, the substrate being configured as a cylinder having a diameter and first and second ends;

at least one 3-D coil of semiconductor material formed on the substrate surface; and a 3-D coil of a conductive metal disposed on the at least one coil of semiconductor material, wherein the second end includes a flange having a diameter greater than the diameter of the cylinder, the flange providing a contact electrically connected to the at least one coil of semiconductor material to provide a semiconductor-to-semiconductor connection of the at least one semiconductor coil of a first coil unit with an at least one semiconductor coil of a second coil unit coupled head-to-tail in parallel with the first coil unit.

* * * * *